United States Patent
Shumarayev et al.

(10) Patent No.: US 8,787,352 B2
(45) Date of Patent: *Jul. 22, 2014

(54) HETEROGENEOUS TRANSCEIVER ARCHITECTURE FOR WIDE RANGE PROGRAMMABILITY OF PROGRAMMABLE LOGIC DEVICES

(75) Inventors: Sergey Shumarayev, San Leandro, CA (US); Bill W. Bereza, Nepean, CA (US); Chong H. Lee, San Ramon, CA (US); Rakesh H. Patel, Cupertino, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 406 days.

This patent is subject to a terminal disclaimer.

(21) Appl. No.: 13/103,132

(22) Filed: May 9, 2011

(65) Prior Publication Data

US 2011/0211621 A1    Sep. 1, 2011

Related U.S. Application Data

(63) Continuation of application No. 12/576,507, filed on Oct. 9, 2009, now Pat. No. 7,940,814, which is a continuation of application No. 11/402,417, filed on Apr. 11, 2006, now Pat. No. 7,616,657.

(51) Int. Cl.
*H04L 12/28* (2006.01)
*H04L 5/14* (2006.01)
*H04L 27/00* (2006.01)

(52) U.S. Cl.
CPC . *H04L 5/14* (2013.01); *H04L 27/00* (2013.01)
USPC .............................. 370/351; 370/473; 326/37

(58) Field of Classification Search
USPC ................. 370/473–474, 351, 389, 518, 536; 326/37–41
See application file for complete search history.

(56) References Cited

U.S. PATENT DOCUMENTS

| | | | |
|---|---|---|---|
| 6,650,638 B1* | 11/2003 | Walker et al. | 370/389 |
| 6,724,328 B1 | 4/2004 | Lui et al. | |
| 6,750,675 B2* | 6/2004 | Venkata et al. | 326/41 |
| 6,946,873 B1 | 9/2005 | Sendrovitz | |
| 7,227,918 B2 | 6/2007 | Aung et al. | |
| 7,411,464 B1 | 8/2008 | Hoang et al. | |
| 7,539,278 B2 | 5/2009 | Shumarayev et al. | |
| 2004/0042504 A1* | 3/2004 | Khoury et al. | 370/518 |
| 2007/0127616 A1* | 6/2007 | Shumarayev et al. | 375/376 |
| 2009/0122939 A1 | 5/2009 | Hoang et al. | |

FOREIGN PATENT DOCUMENTS

EP    1 248 372    10/2002

* cited by examiner

*Primary Examiner* — Ricky Ngo
*Assistant Examiner* — Iqbal Zaidi
(74) *Attorney, Agent, or Firm* — Ropes & Gray LLP

(57) ABSTRACT

High-speed serial data transceiver circuitry on a programmable logic device ("PLD") includes some channels that are able to operate at data rates up to a first, relatively low maximum data rate, and other channels that are able to operate at data rates up to a second, relatively high maximum data rate. The relatively low-speed channels are served by relatively low-speed phase locked loop ("PLL") circuitry, and have other circuit components that are typically needed for handling data that is transmitted at relatively low data rates. The relatively high-speed channels are served by relatively high-speed PLLs, and have other circuit components that are typically needed for handling data that is transmitted at relatively high data rates.

18 Claims, 3 Drawing Sheets

HETEROGENEOUS TRANSCEIVER ARCHITECTURE FOR WIDE RANGE PROGRAMMABILITY OF PROGRAMMABLE LOGIC DEVICES

CROSS-REFERENCE TO RELATED APPLICATIONS

This application is a continuation of U.S. patent application Ser. No. 12/576,507, filed Oct. 9, 2009 (now U.S. Pat. No. 7,940,814), which is a continuation of U.S. patent application Ser. No. 11/402,417, filed Apr. 11, 2006 (now U.S. Pat. No. 7,616,657), each of which is hereby incorporated by reference herein in its entirety.

BACKGROUND OF THE INVENTION

This invention relates to programmable logic device integrated circuits and generally similar circuitry, all of which are generically referred to herein as programmable logic devices or PLDs. More particularly, the invention relates to high-speed serial data transceiver circuitry for use on PLDS.

PLDs are relatively general-purpose devices that are designed to be able to satisfy a wide range of needs. There is increasing interest in the use of high-speed serial data communication for exchange of information between the devices that make up various kinds of systems. There are many possible "protocols" for such high-speed serial communication. Some of these protocols may be industry-standard protocols. Other protocols may be custom-designed for particular systems. A particular protocol typically involves such things as how is the data formatted; how many channels are used together to provide the overall communication link; at what speed (serial data rate or bit rate) is a channel operated; if multiple channels are employed to provide a link, how much skew (differential delay) can there be between the channels; etc. With regard to speed, there is always a desire for faster communication. For example, speeds up to about 6 Gbps (gigabits per second) are now being routinely employed, and speeds up to 10-12 Gbps are anticipated or are starting to be used.

It is a considerable challenge to design a PLD that can support a wide range of possible serial data communication speeds, including speeds at the upper end of the ranges mentioned above.

SUMMARY OF THE INVENTION

In accordance with this invention, serial data receiver circuitry on a PLD may include a plurality of channels of receiver circuitry that are adapted for operation at data rates up to a first relatively low maximum serial bit rate, and at least one further channel of receiver circuitry that is adapted for operation at data rates up to a second relatively high maximum serial bit rate. The circuitry further includes at least one phase-locked loop ("PLL") circuit that is adapted for supplying clock signals at up to a first relatively low maximum frequency for use by the first-mentioned receiver channels. The circuitry still further includes at lease one further PLL circuit that is a adapted for supplying clock signals at up to a second relatively high maximum frequency for use by the second-mentioned receiver channel. The second-mentioned PLL circuit can also be used by the first-mentioned receiver channels if the second-mentioned PLL circuit is operating at a frequency within the operating range of the first-mentioned receiver channels. The second-mentioned PLL circuit preferably has a dedicated connection to the second-mentioned receiver channel.

Each of the two types of receiver channels preferably includes other circuitry that is typically needed for processing data signals that can be expected in that type of channel. For example, the lower-speed channels may include 10-bit-to-8-bit decoder circuitry, but not 66-bit-to-64-bit decoder circuitry; while the higher-speed channels may include 66-bit-to-64-bit decoder circuitry, but not 10-bit-to-8-bit decoder circuitry.

Each receiver channel may also include associated transmitter circuitry, so that each channel may actually be a transceiver channel. The transmitter circuitry (if any) associated with receiver circuitry preferably has speed characteristics and other capabilities comparable to those of the associated receiver circuitry.

Further features of the invention, its nature and various advantages, will be more apparent from the accompanying drawings and the following detailed description.

DETAILED DESCRIPTION

Figure 1:
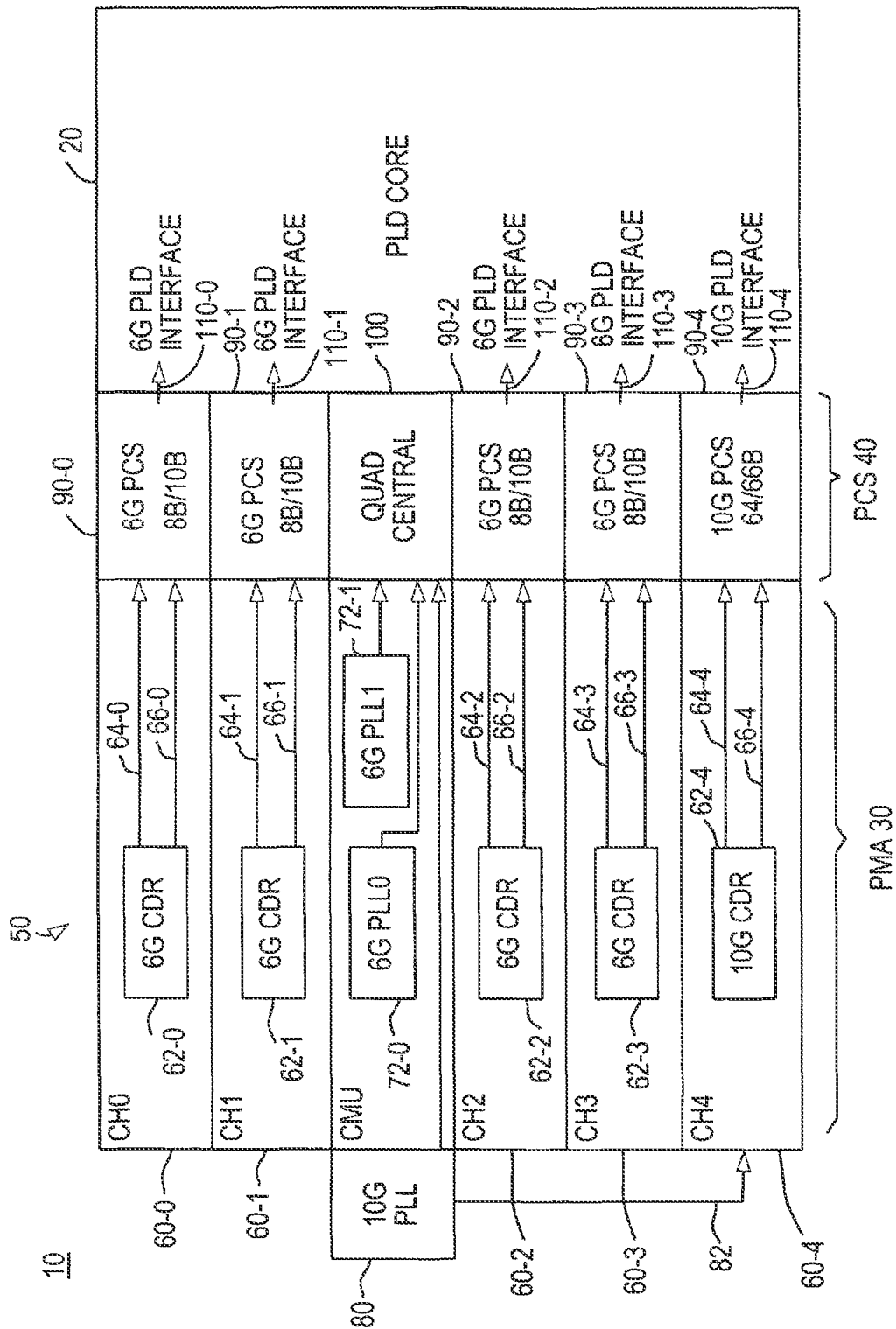
FIG. 1 is a simplified schematic block diagram of an illustrative embodiment of circuitry in accordance with the invention.

FIG. 1 shows illustrative circuitry in accordance with the invention that is primarily serial data receiver circuitry. Those skilled in the art will appreciate that this circuitry can also include or be used with serial data transmitter circuitry, so that the combined receiver and transmitter circuitry constitutes transceiver circuitry. This possibility is considered in more detail later in this specification, including in conjunction with FIG. 3. Everything shown in FIG. 1 is part of a PLD integrated circuit 10.

The circuitry shown in FIG. 1 includes PLD core 20, which is typically the major portion of most PLDs. PLD core 20 includes the general-purpose programmable logic, programmable interconnect, and other relatively general-purpose circuitry of the PLD. Also shown in FIG. 1 is some physical media access ("PMA") layer circuitry 30 and some physical coding sublayer ("PCS") circuitry 40 of PLD 10. The depicted circuitry 30 and 40 may be only a representative portion of more such circuitry that PLD 10 may include.

The PMA and PCS circuitry 30 and 40 shown in FIG. 1 may be the PMA and PCS circuitry of one so-called "quad" 50 of high-speed serial interface circuitry on PLD 10. Quad 50 may be only one of several instances of such circuitry on PLD 10. Quad 50 may be referred to as heterogeneous because it includes four channels of high-speed serial interface circuitry (and related circuitry) that are designed for operation at serial data bit rates up to a first, relatively low, maximum bit rate (e.g., approximately 6 Gbps), and one additional channel (and related circuitry) that is designed for operation at serial data bit rates up to a second, relatively high, maximum bit rate (e.g., approximately 10 Gbps). These various channels (and their constituent components and related circuitry) will sometimes be referred to using these exemplary approximate bit rates. For example, the four channels that can operate at up to 6 Gbps may be referred to as 6G channels, and the one channel that can operate at up to 10 Gbps may be referred to as a 10G channel. It will be understood that these bit rate maximum values are only examples, and the first and second (or relatively high and relatively low) maxima can be different from these exemplary values if desired. It will also be understood that circuitry described herein as having a "maximum" operating characteristic does not have to be operated at that maximum in all cases. That is why such a component is referred to as being operable at "up to" its maximum. Typically such a component is operable at any one of a plurality of different values of the relevant parameter, up to the described maximum value of that parameter.

Considering FIG. 1 now in more detail, the PMA 30 portion of quad 50 includes four 6G channels 60-0 through 60-3, one 10G channel 60-4, clock multiplier unit ("CMU") circuitry 70, and additional 10G phase-locked loop ("PLL") circuitry 80.

Each of channels 60 includes circuitry for receiving a serial data signal and converting the data in that signal to parallel form on several parallel data leads. For example, each of channels 60-0 through 60-3 is shown as including 6G CDR (clock and data recovery) circuitry 62-0 through 62-3, respectively. Each CDR circuit 62 is capable of receiving a serial data signal, recovering from that signal the clock signal with which the serial data signal is synchronized, and also recovering so-called retimed data from the serial data signal. The PMA 30 portion of each channel 60-0 through 60-3 also includes circuitry for converting the retimed data from serial to parallel form. For example, if 10-bit-to-8-bit decoding is being used, each channel 60-0 through 60-3 may convert successive groups of ten serial bits to ten parallel bits for application to the downstream circuitry. Alternatively, if such decoding is not being used, each channel 60-0 through 60-3 may convert successive groups of eight serial bits to eight parallel bits for application to the downstream circuitry. This choice can be made on a channel-by-channel basis. To complete this thought (although it takes us out of PMA 30 into PCS 40), each channel 60-0 through 60-3 has associated PCS circuitry 90-0 through 90-3, which includes 6G 10-bit-to-8-bit decoder circuitry that is optionally usable to convert each successive ten bits of parallel data to an eight-bit byte of parallel data if 10-bit-to-8-bit decoding is being used. Each of PCS channels 90-0 through 90-3 can pass on parallel bytes of data to PLD core 20. As is suggested by the labeling in FIG. 1, components 60-0 through 60-3 and 90-0 through 90-3 are constructed and operable to support serial data communication at up to about 6 Gbps.

PMA channel 60-4 is similar, in a general way, to any one of channels 60-0 through 60-3. However, channel 60-4 is constructed and operable to support serial data communication at up to about 10 Gbps. In addition to having this difference in speed capability, channel 60-4 may be constructed to support other features of communication protocols that are likely to use serial data rates up to about 10 Gbps. For example, these communication protocols frequently use 66-bit-to-64-bit decoding rather than 10-bit-to-8-bit decoding. Accordingly, in addition to its 10G CDR circuitry 62-4, the PMA 30 portion of channel 60-4 (and associated downstream circuitry such as 10G PCS channel 90-4) may include circuitry for deserializing the retimed data output by CDR circuitry 60-4 in a manner appropriate for 66-to-64 decoding, and then optionally performing such decoding in associated 10G PCS channel 90-4.

CMU 70 includes two 6G PLL circuitries 72-0 and 72-1. PLL circuits 72 are labeled "6G" because each of these circuits is capable of producing clock signals that can be used to support serial data communication at rates up to about 6 Gbps. For example, each of PLLs 72 may receive a respective reference clock signal, and may use that signal to produce clock signals that can be used by one or more of channels 60-0 through 60-3 to enable those channels to perform the operations described for them above. PLL circuit 80 may be functionally similar to either of circuits 72, except that whereas circuits 72 are constructed and operable to produce clock signals suitable for serial data rates up to about 6 Gbps, circuit 80 is constructed and operable to produce clock signals suitable for serial data rates up to about 10 Gbps. Circuit 80 may receive and make use of a reference clock signal different from the reference clock signals applied to PLLs 72.

Output clock signals of circuits 72 and 80 are applied to quad central circuitry 100. A function of circuitry 100 is to distribute the output clock signals of circuits 72 and 80 to channels 60-0 through 60-3 and 90-0 through 90-3. Each of these channels 60/90 can select which of the distributed clock signals it is going to use. Thus each of these channels 60/90 can operate on its own, i.e., relatively independently of the other channels. Or two or more of these channels 60/90 can select the same distributed clock signal(s) and thereby operate in synchronized fashion. From this it will be seen that even 10G PLL 80 can be a source of clock signals for 6G channels 60-0 through 60-3 and 90-0 through 90-3, if in a particular application 10G PLL 80 is outputting at a low enough frequency.

The output clock signals of 10G PLL 80 are also applied directly to 10G channel 60-4 and 90-4 via connections 82. This is the route by which channel 60-4 and 90-4 gets the clock signals it needs to operate a data rates up to about 10 Gbps. Route 82 may sometimes be referred to as dedicated.

Note that each of channels 60 outputs parallel data to the associated PCS circuitry 90 via leads 64. Also, each of channels 60 outputs one or more clock signals to the associated PCS circuitry 90 via lead(s) 66. Each of PCS channels 90 outputs parallel data (and other appropriate signals) to PLD core 20 via the associated 6G or 10G PLD interface 110. These interfaces may be of different widths and/or may be used in different ways. For example, each 6G PLD interface may include 16 parallel data leads, and may be able to convey one or two 8-bit bytes in parallel, as desired. In other words, each of PCS channels 90-0 through 90-3 may be able to put two successive 8-bit bytes side by side for passage to PLD core 20 in parallel. 10G PLD interface 110-4 may be able to apply up to 64 parallel bits to PLD core 20. The associated control signals in the 6G PLD interfaces may also be different than the control signals in 10G PLD interface 110-4.

As was briefly mentioned earlier, FIG. 1 shows data flow from PMA 30 through PCS 40 to PLD core 20. This is receiver operation of the circuitry. But the circuitry shown in FIG. 1 can also include components that allow data to flow in the opposite direction through any or all of channels 60/90. This is transmitter operation of the circuitry. The data signal processing operations of the channels that are described above are basically reversed in any channel that is operating as a transmitter. For example, in a 6G channel, parallel data from PLD core 20 may be subjected to 8-bit-to-10-bit encoding, followed by serialization and transmission as a serial data signal. Similarly, in the 10G channel, parallel data from PLD core 20 may be subjected to 64-bit-66-bit encoding, followed by serialization and transmission as a serial data signal. Clock signals from PLLs 72/80 may be used in these transmitter operations. Because quad 50 may thus have both receiver and transmitter capabilities, it may be referred to as transceiver circuitry. Also, to simplify terminology, 10-bit-to-8-bit decoding and 8-bit-to-10-bit encoding may sometimes be referred to generically as just 8B/10B coding. Similarly, 66-bit-to-64-bit decoding and 64-bit-to-66-bit encoding may sometimes be referred to generically as just 64/66 or 64/66B coding. Again, transmitter aspects of the invention will be further considered below in connection with FIG. 3.

Figure 2:
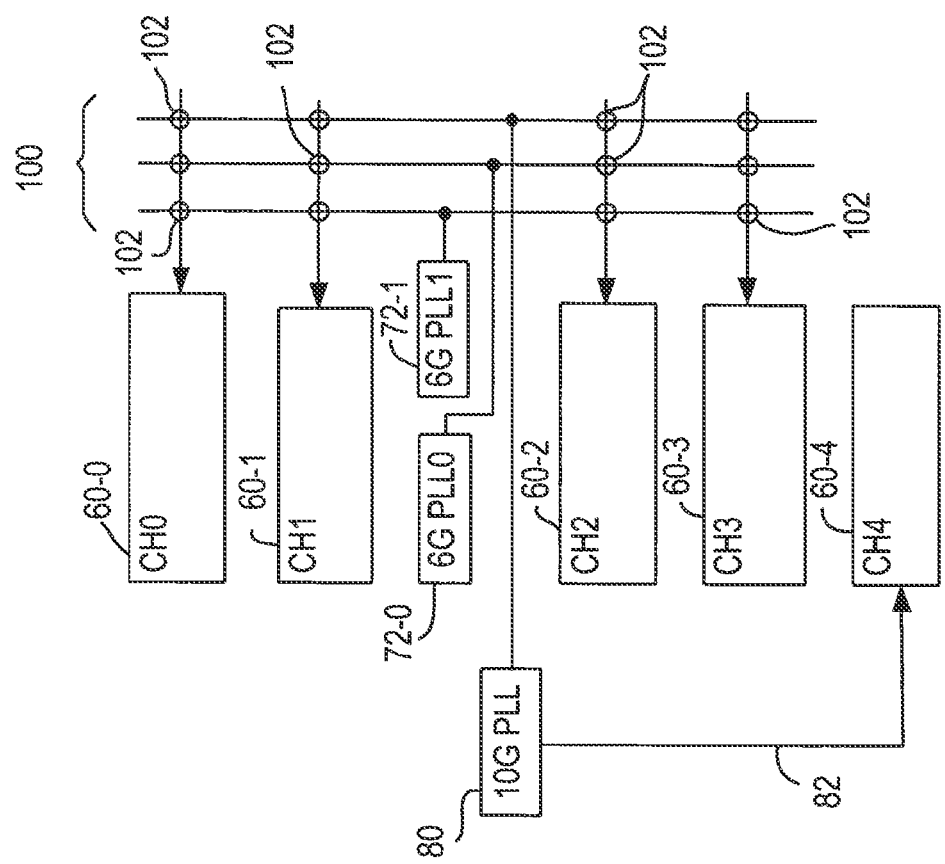
FIG. 2 is a simplified schematic block diagram showing a portion of FIG. 1 in more detail in accordance with the invention.

FIG. 2 shows in more detail how the output clock signals of PLLs 72 and 80 can be supplied to the various channels 60. In particular, FIG. 2 shows that a respective one of conductors or buses 100 conveys output signals of each of PLLs 72 and 80 adjacent to each of channels 60-0 through 60-3. Programmably controllable connections 102 allow each of these channels to select which of PLLs 72/80 that channel will get its clock signals from. For example, all four channels 60-0 through 60-3 can select the same source, or various channels can make different selections. Channel 60-4 can get its clock signal(s) only from PLL 80 via dedicated path 82.

Figure 3:
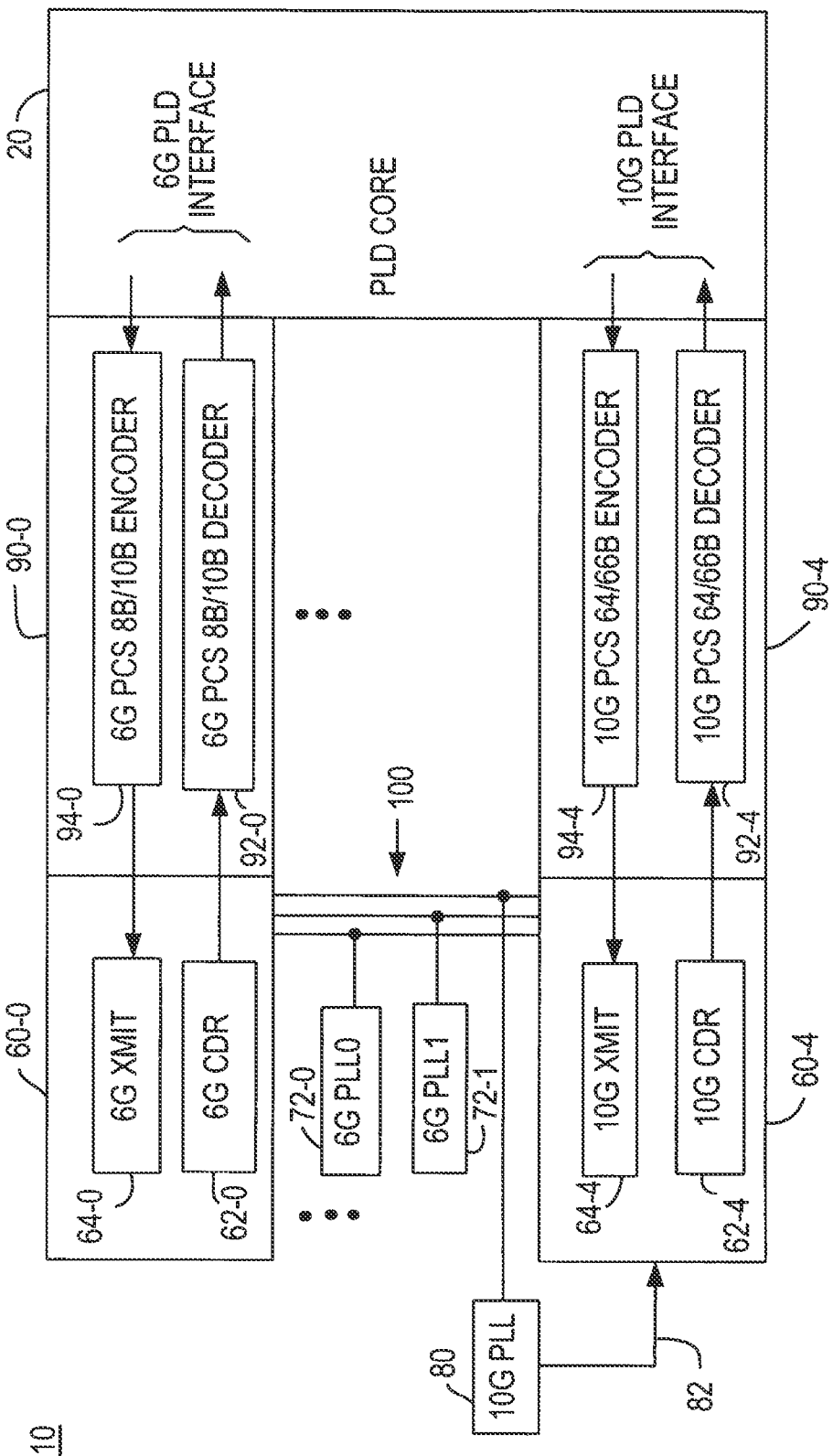
FIG. 3 is a simplified schematic block diagram showing how representative portions of FIG. 1 can be optionally augmented with more circuitry in accordance with the invention.

FIG. 3 shows that transmitter circuitry can be added to any or all of channels 60/90. As shown in FIG. 3, representative channel 60-0/90-0 includes 6G transmitter 64-0 and 6G PCS 8B/10B encoder circuitry 94-0. Channel 60-4/90-4 includes 10G transmitter circuitry 64-4 and 10G PCS 64/66B encoder circuitry 94-4. Channels that include both receiver and transmitter circuitry may be referred to as transceiver channels. The transmitter portion of a channel like 60-0/90-0 can receive parallel data from PLD core 20, optionally subject that data to 8-bit-to-10-bit encoding in a component like 94-0, and then (in an XMIT or serializer component like 64-0) convert the data to a serial data signal for transmission off the device. Similarly, the transmitter portion of channel 60-4/90-4 can receive parallel data from PLD core 20, optionally subject that data to 64-bit-to-66-bit encoding in component 94-4, and then (in XMIT or serializer component 64-4) convert the data to a serial data signal for transmission off the device. The transmitter portion of any channel preferably has speed and other signal processing capabilities that are similar or complementary to those of the receiver portion of that channel.

We now turn to consideration of some of the advantages of circuitry of the type shown in FIG. 1, as well as some examples of possible modifications. Although CMU 70 is shown including two 6G PLLs 72, this number can vary. Two PLLs 72 is presently preferred because it is thought to give the optimum between flexibility and complexity. Note that the maximum data rate division between the PLLs 72 in CMU 70 and PLL 80 can be different from that employed in the illustrative embodiment shown in FIG. 1. Note also that each maximum data rate can be chosen separately, and that there can be more than two different maximum data rates if desired. For example, PLLs 72 and channels 60-0 through 60-3 may have a 6G maximum data rate as shown in FIG. 1, but the maximum data rate of components 80 and 60-4 may be 12G. As another example, one PLL 72 and some channels 60 may have a 4G maximum data rate, another PLL 72 and some other channels 60 may have a 6G maximum data rate, and PLL 80 and channel 60-4 may have a 10G maximum data rate.

Different PLLs 72 and 80 may be constructed differently, depending on the frequencies or frequency ranges they are intended to support. (See, for example, Shumarayev et al. U.S. patent application Ser. No. 11/292,565, filed Dec. 2, 2005.)

Each channel slice 60-0 through 60-3 and 90-0 through 90-3 contains 6G CDR, while the fifth channel slice 60-4 and 90-4 is able to support higher data rates (up to 10G in the FIG. 1 example). Each 6G channel communicates to 6G PCS 90 including programmable 8B/10B support. 10G channel 60-4 is connected to 10G PCS 90-4, which may have different requirements such as 64/66 coding. In this way, from the point of view of PCS 40, each part of that circuitry can have a reduced set of requirements. The features typically needed to support 6G can be provided in the four channels 90-0 through 90-3 that are dedicated to 6G, while the features that are typically needed to support 10G are provided in a separate channel 90-4. All PCS channels 90 do not need to have all capabilities. The same approach is extended to the PCS-PLD interface 110, where different numbers of signals and clocks are required, depending on whether the interface is for 6G (110-0 through 110-3) or 10G (110-4).

From the point of view of PMA 30, separating elements 80 and 60-4 from the 6G channels means that the 10G PLL and CDR designs do not over-burden the 6G channels. Conversely, the flexibility requirements of the 6G channels (i.e., to support any of many different communication protocols having data rates up to 6G) do not hinder sensitive 10G nodes.

A heterogeneous transceiver architecture as shown and described herein facilitates staged product characterization and roll-out. While all technology issues are addressed, the higher-speed parts of the design can be allowed to proceed at an appropriate pace without preventing introduction of other products in the family that do not include those higher-speed capabilities. For example, the first members of a product family can be released to customers with four out of five available channels, thereby improving time to market. Additional time can then be taken to perfect new technology for the higher-speed parts of the design. Products in the family with 10G channels (or whatever the higher-speed data rate currently is) can be unveiled later. Alternatively, the later products can be introduced as a separate product (6G plus 10G), while the early release was sold as 6G only. Such separation can also allow improving cost from the yield point of view. 10G is assumed to have a lower yield than 6G. Hence dies that do not have working 10G channels can be sold as 6G-only parts.

The invention also has various system benefits. For example, 10G channels benefit more (as compared to 6G links) from preferential placement and better loss characteristics. The preferred embodiments described above require only about 20% of all channels to be treated with extreme care. If all channels were constructed with all capabilities (i.e., both 6G and 10G capabilities), it might not be possible to give all channels the preferential placement and loss characteristics that facilitate 10G operation.

Still another advantage of the invention is that power supply filtering consideration can differ between the two (or more) channel types. Internal regulating for 6G and 10G can be designed according to their specifics. External de-coupling can be chosen to complement internal design.

In sum, the architectures of this invention can continuously cover a wide data rate range with heterogeneous channel offerings. This approach allows individual power and area optimization of each link type. This affords significant risk reduction, improving overall cost and time to market.

It will be understood that the foregoing is only illustrative of the principles of the invention, and that various modification can be made by those skilled in the art without departing from the scope and spirit of the invention. For example, the particular data rates mentioned herein are only illustrative, and other data rates (e.g., other than 6G and 10G) can be used instead if desired. As another example of possible modifications, the ratio of relatively high data rate channels to relatively low data rate channels can be different from the oneto-four ratio illustrated herein. As still another example of possible modifications, the number of different maximum data rates implemented can be more than two.

The invention claimed is:

1. A serial data receiver comprising:
   a plurality of channels each having a serial bit rate operating range, wherein each of the plurality of channels is operable to receive a serial data signal and operate at the serial bit rate operating range, and wherein a first serial bit rate operating range of a first channel of the plurality of channels exceeds a second serial bit rate operating range of a second channel of the plurality of channels;
   a set of first conductors that distribute a first and a second clock signal, generated respectively by a first and a second phase-locked loop circuitry, to the second channel;
   a second conductor that distributes the second clock signal to the first channel, wherein the first clock signal is suitable for a third serial bit rate operating range and the second clock signal is suitable for a fourth serial bit rate operating range, and wherein the fourth serial bit rate operating range exceeds the third serial bit rate operating range; and
   circuitry for allowing the second channel to select the first or the second clock signal for use by the second channel.

2. The serial data receiver of claim 1, wherein the first clock signal is suitable for at least a 6 Gbps serial bit rate operating range and the second clock signal is suitable for at least a 10 Gbps serial bit rate operating range.

3. The serial data receiver of claim 1, wherein the first channel is operable to receive the second clock signal but not the first clock signal.

4. The serial data receiver of claim 1 further comprising:
   a programmable element associated with the second channel, wherein the programmable element is operable to couple the second channel to either (1) one of the first conductors or (2) the second conductor.

5. The serial data receiver of claim 1, wherein the first serial bit rate operating range of the first channel is 10 Gbps and the second serial bit rate operating range of the second channel is 6 Gbps.

6. The serial data receiver of claim 1, wherein the first serial bit rate operating range of the first channel is at least 10 Gbps and the second serial bit rate operating range of the second channel is at least 6 Gbps.

7. The serial data receiver of claim 1, wherein:
   a third channel of the plurality of channels is operable to operate at the second serial bit rate operating range;
   the set of first conductors distribute the first and a third clock signal to the third channel; and
   the circuitry allows the third channel to select the first or the third clock signal for use by the third channel.

8. The serial data receiver of claim 1, wherein the first serial bit rate operating range is a maximum serial bit rate operating range of the first channel and the second serial bit rate operating range is a maximum serial bit rate operating range of the second channel.

9. The serial data receiver of claim 1, wherein the first channel includes a first clock data recovery circuit operable to operate at the first bit rate operating range and the second channel includes a different second clock data recovery circuit operable to operate at the second bit rate operating range.

10. A method for configuring a plurality of transceiver channels, the method comprising:
    configuring a first channel of the plurality of transceiver channels to receive a serial data signal, wherein a first serial bit rate operating range of the first channel exceeds a second serial bit rate operating range of a second channel of the plurality of transceiver channels;
    causing a first and a second clock signal, generated respectively by a first and a second phase-locked loop circuitry, to be distributed to the second channel;
    configuring the second clock signal to be coupled to the first channel, wherein the first clock signal is suitable for a third serial bit rate operating range and the second clock signal is suitable for a fourth serial bit rate operating range, and wherein the fourth serial bit rate operating range exceeds the third serial bit rate operating range; and
    allowing the second channel to select the first clock signal or the second clock signal for use by the second channel.

11. The method of claim 10, wherein the first clock signal is suitable for at least a 6 Gbps serial bit rate operating range and the second clock signal is suitable for at least a 10 Gbps serial bit rate operating range.

12. The method of claim 10, wherein the first channel is operable to receive the second clock signal but not the first clock signal.

13. The method of claim 10, wherein the first serial bit rate operating range of the first channel is 10 Gbps and the second serial bit rate operating range of the second channel is 6 Gbps.

14. The method of claim 10, wherein the first serial bit rate operating range of the first channel is at least 10 Gbps and the second serial bit rate operating range of the second channel is at least 6 Gbps.

15. The method claim 10, wherein a third channel of the plurality of channels is operable to operate at the second serial bit rate operating range, further comprising:
    causing the first and a third clock signal to distributed to the third channel; and
    allowing the third channel to select the first or the third clock signal for use by the third channel.

16. The method of claim 10, wherein the first serial bit rate operating range is a maximum serial bit rate operating range of the first channel and the second serial bit rate operating range is a maximum serial bit rate operating range of the second channel.

17. The method of claim 10, wherein the first channel includes a first clock data recovery circuit operable to operate at the first bit rate operating range and the second channel includes a different second clock data recovery circuit operable to operate at the second bit rate operating range.

18. The method of claim 10 further comprising configuring the first clock signal and the second clock signal to be selectively supplied to the second channel.

* * * * *